May 18, 1965 E. C. SINGLETARY 3,184,649

MINIATURE CIRCUIT ASSEMBLY

Filed Aug. 18, 1961

ERNEST C. SINGLETARY
INVENTOR.

BY D. Carl Richards 3,184,649

MINIATURE CIRCUIT ASSEMBLY

Ernest C. Singletary, Dallas, Tex., assignor to Texas Instruments Incorporated, Dallas, Tex., a corporation of Delaware Filed Aug. 18, 1961, Ser. No. 132,481
8 Claims. (Cl. 317—101)

This invention relates to an assembly of miniature circuit modules and more particularly to provisions for miniaturized electrical circuit connections.

Development of semiconductor devices permits production of electrical circuit elements of such small size that interconnection of the leads from one element to another presents a serious problem if full advantage of the miniaturized circuit element is to be retained.

Semiconductor networks of the type above referred to are illustrated and described by Lathrop et al., "Electronics," May 13, 1960, in a paper entitled "Semiconductor Networks." As there illustrated, semiconductor networks comprise small modules which may include a complete operative circuit such as a multivibrator or amplifier or the like, all contained within a solid body having dimensions of 1/32" thick, 1/8" wide and 1/4" long. A variety of circuits may be fabricated in such modules. Each module for a given circuit would have a predetermined number of leads for connecting the circuit to external sources of signal and supply voltages. In certain devices thus far provided ten leads extend from two opposite sides of the modular block with five extending from one face and five extending from the opposite face. When several such modules are to be interconnected in the system, it becomes impossible closely to space the modules and interconnect them in accordance with conventional techniques. On the other hand, if close spacing is not maintained, much of the advantage of a miniaturized unit to a large extent is lost.

The present invention provides for the interconnection of modules, permitting them to be maintained closely spaced and at the same time lending all necessary flexibility for any such interconnection as may be desired. A universal coupling unit is employed which may readily be adapted to accommodate almost any interconnection requirement.

More particularly, in accordance with the present invention there is provided an assembly which includes a stack of at least two planar electrical modules with at least one lead extending from each of said modules at the sides of the stack where the leads are located in one of a plurality of selected spaced-apart contact areas, which areas lie exclusively within one of several spaced bands extending around said stack. A planar conductive sheet is positioned intermediate the modules and forms a part of the stack. Sheet insulators on either side of the conductive sheet isolate the conductive sheet from the adjacent modules. The conductive sheet is characterized by having integral taps extending from the faces of the stack in the same bands as the lead from one of the modules and a second integrally formed tab extending from the face of the stack in the same band as the lead from the second of the modules. Electrical conductor means are then provided for interconnecting each lead with one tab to complete the conductive path from the first to the second modules by way of the conductive sheet.

For a more complete understanding of the present invention and for further objects and advantages thereof, reference may now be had to the following description taken in conjunction with the accompanying drawings in which.

Figure 1:
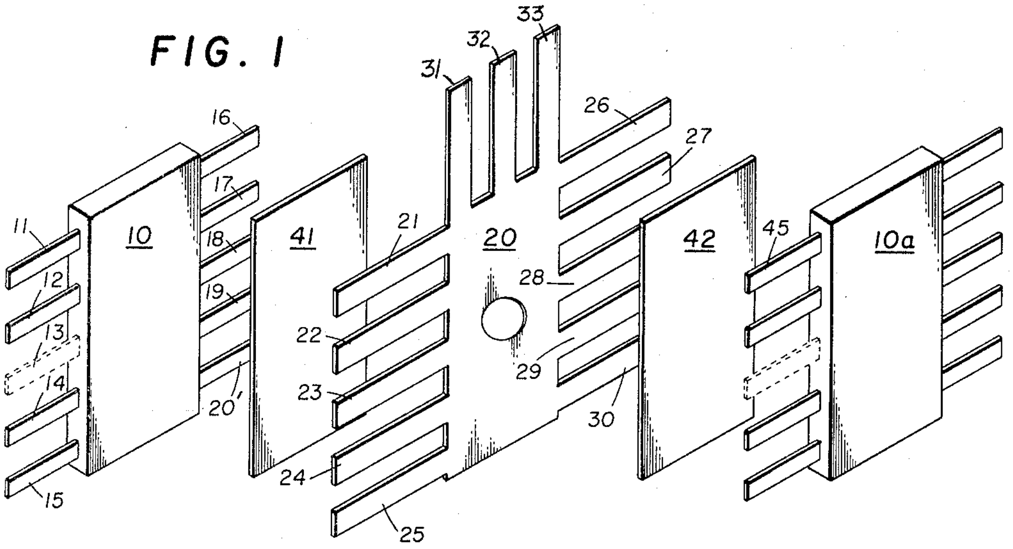
FIG. 1 is an exploded assembly view of the invention.

Referring now to FIG. 1, there is illustrated a circuit module 10 which is in the form of a rectangular polyhedron. Extending from sides having the dimension of 1/4" x 1/32" are a plurality of circuit leads. More particularly, five leads 11–15 may extend from one side and five leads 16–20' may extend from the opposite side. Lead 13 is shown dotted as to indicate position only. The module 10 may include one or more active devices such as transistors together with static circuit elements such as resistors or capacitors or the like to form an operative circuit element which is to be interconnected with like elements to form an operative assembly.

A universal interconnection unit 20 is employed to provide connection to and from modules in a stack. More particularly, a flat sheet of a low resistance conductive material is formed as a rectangular body whose outer dimensions substantially correspond with the dimensions of the module 10.

Figure 2:
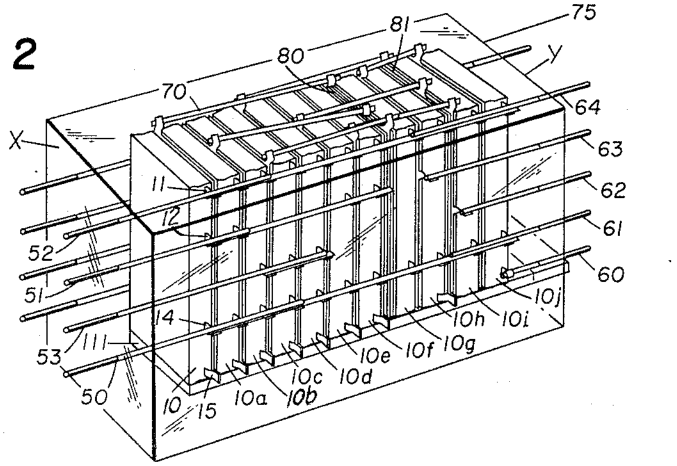
FIG. 2 is an isometric view of a completed unit.

As illustrated in FIG. 1, the universal unit 20 is provided with a plurality of tabs 21, 22, 23, 24 and 25 extending from the left side as viewed in FIG. 1 with tabs 26, 27, 28, 29 and 30 extending from the right hand side thereof. In addition, three tabs 31, 32 and 33 extend from the top. The tabs 21–25 extend from the unit 20 at zones which correspond with the locations of leads 11–15 extending from body 10. Similarly, the tabs 26–30 are positioned to mate with leads 16–20'. In providing a completed assembly, a plurality of units, such as the module 10, the unit 20 and a further module **10*a*, are provided. A pair of insulating sheets 41 and 42 having dimensions corresponding with the dimensions of the modules 10 and 10*a* are provided to isolate the universal unit 20 from the body portions of the modules 10 and 10*a*. In practice, a stack of units such as illustrated in FIG. 1 may include a dozen or more circuit modules. Such a stack is illustrated in FIG. 2 where twelve modules including the modules 10 and 10*a* form a stack with one or more of the interconnecting units such as unit 20 interleaved between each of the adjacent modules. Insulating sheets such as sheets 41 and 42 separate each universal unit from adjacent modules and from like universal units. In practice, the modules 10, 10*a*–10*n* may not have the ten leads each extending therefrom. A given modular circuit may require only two or three leads in order to supply necessary operating voltages to and extract signals from a given module. When such is the case, interconnections are made between modules and to external circuits by means of the universal unit 20. The tabs 21–33 will be selectively trimmed from the universal unit for each of the intermodule locations. Connections will then be made from a given module to the universal unit 20 on a selective basis to provide the necessary circuits to and from the complete stack. As indicated in FIG. 2, the module 10 utilizes only the leads 11, 12, 14 and 15. In this case the tab 23 on the connecting unit 20 is removed. A solder joint is made between lead 15 and tab 25. The lead 14 is connected to a bus bar 50. The lead 12 is connected to a bus bar 51 and the lead 11 and tab 45 are both connected to a bus bar 52. It will be noted that a bus bar 53 serves to interconnect leads and tabs in the zone of lead 13 on each of the modules 10*b*, 10*c* and 10*d*. Similarly, the bus bar 51 interconnects the leads and tabs at the zone of lead 12 on module 10 to a similar lead on module 10*a* and to leads similarly located on modules 10*e* and 10*f*. Bus bars 60, 61, 62, 63 and 64 extend to the stack of modules along the same side as bus bars 50–53** and are selectively connected to leads on the modules as well as tabs on the unversal units. It will also be noted that tabs from the universal units extend upward from the stack, such tabs lying in zones corresponding with the locations of tabs 31–33 on unit 20 of FIG. 1. Bars or conductive strips such as strip 70 serve to interconnect selected ones of the universal units to provide the desired circuit operation.

This system of interconnection will permit conventional modular units of varying lead configurations to be interconnected one with another and to outside circuits by means of the universal unit 20 suitably connected to bus bars. As indicated in FIG. 2, the stack of eleven units 10–10*j* is encapsulated in a non-conductive body 75 formed from a suitable potting material such as a plastic. The bars 50–52 and 60–64 extend from opposite ends of the stack and provide for interconnecting the unit to further system elements. Accessibility thus provided is adaptable to any modular type unit in which circuit modules are provided with leads at any one of a plurality of conductor bands encircling the modular stack.

Figure 3:
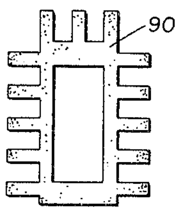
FIG. 3 illustrates a modified universal connector unit.
Figure 4:
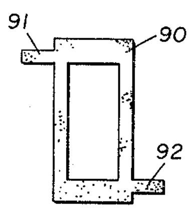
FIG. 4 illustrates the unit of FIG. 3 trimmed for a particular circuit function.

The universal unit 20 of FIG. 1 is provided with a central hole. In the modification of FIG. 3 universal unit 90 is provided with the major portion of the body thereof removed, leaving only a peripheral band from which the tabs extend. The body 90 may then be selectively trimmed, for example as illustrated in FIG. 4. In this case only two tabs, tabs 91 and 92, remain and provide for connections thereto at opposite sides and at opposite corners of a modular stack.

In one embodiment of this invention where the circuit module 10 was of dimensions of the order of ¼" long, ⅛" wide and 1/32" thick, twelve such modules were assembled in a stack which included insulating laminations 41, 42 as well as universal connector units 20.

In assembly the various units were first secured together by application of a thin coat of adhesive in order that they could be held in place one with respect to the other for interconnection operations. Interconnection joints of the following types are present in the system:

(A) Interconnection between one universal unit and another;
(B) Interconnection between one universal unit and a network lead such as lead 11;
(C) Interconnection between a universal unit and a flat conductor such as conductor 70;
(D) Interconnection between two network leads such as lead 11 and lead 45;
(E) Interconnection between a network lead such as lead 11 and a flat conductor such as conductor 70; and
(F) Interconnection between a round conductor to either a flat conductor such as conductor 70, a universal unit tab or a network lead such as lead 11.

The joints were made by capacitive discharge resistance welding where a welding head of the tweezer-type hand piece was employed. The universal unit 20 was formed from a nickel-iron-cobalt alloy available and genenrally known as Kovar of 0.002" thickness, plated with gold to enhance conductivity. Gold-plated copper may be found to be suitable. The flat bus bars such as bar 70, FIG. 2, were formed of similar material having dimensions of 0.005" x 0.020". The bus bars such as bar 50 extending from the unit similarly were gold-plated conductors having a diameter of 0.017". For joints such as between the bar 70 and its associated tabs, the tabs were twisted 90° so that a flat surface-to-surface joint could be effected. Similarly, the leads and tabs are twisted to contact the bus bar 53. The insulator sections 41 and 42 were made of a polyester film of the type manufactured and sold by DuPont of Wilmington, Delaware, under the name "Mylar." The resultant stack was encapsulated in a plastic body and had dimensions of about 0.25" thick, 0.30" wide and 0.70" long.

It will be noted that in most of the zones intermediate the modules 10–10*j* of FIG. 2 only one conductive sheet or universal unit 20 is employed. However, at zones 80 and 81 a plurality of universal units separated one from another by insulating sheets are included as a part of the stack to provide greater flexibility where necessary in the interconnection tabs employed. If desired, heat conductive sheets may be provided interleaved with the insulating sheets to provide coupling to a heat sink for cooling the given stack. Thus, the universal units may be selected in number and configuration to supply the needs of almost any interconnection requirement.

Units such as illustrated in FIGS. 3 and 4 may be found preferably where high capacity between adjacent universal units may present a problem in operation of the associated circuits. However, in either case the use of universal units permits the completion of a stack of electronic modules with at least one universal unit between each of the adjacent modules and separated therefrom by insulating sheets. The universal units are provided with connector tabs which are selectively positioned as to lie in lead bands uniformly spaced along the circuit modules for completing connections thereto.

It has been found desirable in some instances to extend all leads such as leads 50–52 and 60–64 from a common surface. In this case a unit such as shown in FIG. 1 is formed in two short stacks and positioned side-by-side. When this is done, faces corresponding to faces X and Y of the block 75 would lie in the same plane and all leads would extend from the same face of the structure. The leads then are more adaptable to plug-in type connections to other units or circuits.

Since the modules are of rectangular polyhedron configuration and the intermodule spaces are planar and are accessible from the bottom face of block 75, a heat-conductive slab bar may be inserted adjacent to any module which, in operation, present a heat problem. For example, intermodule zones 80 or 81 may include a plate of heat-conductive material formed on or connected to bottom plate 111 in heat-conductive relation to conduct heat to a suitable sink.

In a preferred embodiment of the invention, there is a thin, rectangular sheet element positioned adjacent to and coplanar with a rectangular circuit module, each of which has at least one tab and lead respectively extending from adjacent edges thereof with the sheet and said module being separated one from another by a rectangular insulating sheet. Tabs and leads are then interconnected to extend a circuit from the module.

Having described the invention in connection with certain specific embodiments thereof, it is to be understood that further modifications may now suggest themselves to those skilled in the art and it is intended to cover such modifications as fall within the scope of the appended claims.

What is claimed is:

1. In an electronic assembly the combination which comprises a stack of at least two planar electrical modules with at least one lead extending from each of said modules at the sides of said stack and located within selected ones of a plurality of spaced apart contact areas, which areas lie within spaced bands extending around said stack, a planar conductive rim positioned intermediate said modules and forming a part of said stack, sheet insulating means for isolating said rim from adjacent ones of said modules, said rim having a first integrally formed tab extending from the face of said stack in the same band as the lead from one of said modules and a second integrally formed tab extending from the face of said stack in the same band as the lead from the second of said modules, and electrical conductor means interconnecting each said lead with one said tab to complete a conductive path from the first to the second of said modules by way of said rim.

2. An article of manufacture which comprises a thin rectangular conductive sheet element, a rectangular circuit module having at least one lead extending from one edge thereof, said element having a plurality of tabs integrally formed therewith and extending in the plane thereof with one of said tabs in positional registration with said lead, a rectangular sheet insulator interposed between said element and said module, and a connection formed between said lead and said one of said tabs.

3. An electronic assembly which comprises a stack of electronic circuit modules each of rectangular polyhedron configuration and having conductive leads extending from opposite sides of said stack, conductive sheets insulatingly sandwiched between adjacent faces of said modules and having leads extending from said stack in selective alignment with conductive leads from said modules, means for interconnecting said modules and said conductive sheets and including at least one rod-like conductor on each side of said stack extending to points beyond the end of said stack for extending the circuit from said modules to said points outside the limits of said stack, and means for maintaining said modules, sheets and the rod-like conductors in fixed relation one with respect to the other.

4. In an electronic assembly the combination which comprises a stack of plate-like circuit modules, each module having at least one conductive lead extending from each of two opposite sides of said stack in directions perpendicular to said sides, at least one conductive sheet positioned between and insulated from each pair of adjacent faces of said modules, each sheet having tabs extending from said sides of said stack into conjunction with the leads and conductively interconnected therewith in spaced zones at said sides, and conductive bars supported on and connected to said leads and tabs at said zones and extending beyond the ends of said stack.

5. In an electronic assembly the combination which comprises a stack of plate-like circuit modules, each module having conductive leads extending from edges thereof in opposite directions and perpendicular to opposite sides of said stack, conductive sheets positioned between and insulated from each pair of adjacent faces of said modules, each sheet having tabs extending from said sides of said stack into conjunction with said leads and conductively interconnected therewith in spaced zones along said sides, and conductive bars connected in said zones to said leads and tabs and extending beyond the ends of said stack.

6. In an electronic assembly the combination which comprises a stack of plate-like circuit modules, each module having conductive leads extending from edges thereof in opposite directions and perpendicular to the sides of said stack, conductive sheets positioned between and insulated from each pair of adjacent faces of said modules, each sheet having tabs extending from said sides of said stack into conjunction with said leads and conductively interconnected therewith in zones along said sides in which said leads and tabs are spiraled through an angle of 90°, conductive bars connected in said zones to said leads and tabs and extending beyond at least one end of said stack, and an insulating frame encompassing said stack with said bars extending from said frame for connections therethrough to said modules.

7. In an electronic assembly the combination which comprises a stack of plate-like circuit modules, each module having conductive leads extending from edges thereof in opposite directions and perpendicular to the sides of said stack, conductive sheets positioned between and insulated from each pair of adjacent faces of said modules, each sheet having tabs extending from said sides of said stack into conjunction with said leads and conductively interconnected therewith in zones along said sides in which said leads and tabs are spiraled through an angle of 90°, conductive bars connected in said zones to said leads and tabs and extending beyond at least one end of said stack, and a solid insulating body encompassing said stack, leads, and tabs with said bars extending through the surface of said body for connections therethrough to said modules.

8. In an electronic assembly the combination which comprises a stack of plate-like circuit modules, each module having conductive leads extending from edges thereof in opposite directions and perpendicular to the sides of said stack, conductive sheets positioned between and insulated from each pair of adjacent faces of said modules, each sheet having tabs extending from said sides of said stack into conjunction with said leads and conductively interconnected therewith in spaced zones along said sides, electrically conductive bars connected in said zones to said leads and tabs and extending beyond at least one end of said stack, a thermally conductive bar extending along the bottom of said stack and having extensions thereof lying between and parallel to selected ones of said modules for heat removal from said modules, and a rigid insulating frame encompassing said stack, leads, and tabs with said electrically conductive bars and said thermally conductive bar extending from said frame for forming electrical and thermal conduction paths respectively for said stack.

References Cited by the Examiner

UNITED STATES PATENTS

| | | | |
|---|---|---|---|
| 2,907,926 | 10/59 | Slack | 317—101 |
| 3,029,495 | 4/62 | Doctor | 317—101 |

JOHN F. BURNS, *Primary Examiner.*